United States Patent [19]

Weber

[11] Patent Number: 4,816,778
[45] Date of Patent: Mar. 28, 1989

[54] INDUCTORLESS MMIC OSCILLATOR

[75] Inventor: Robert J. Weber, Marion, Iowa

[73] Assignee: Rockwell International Corporation, El Segundo, Calif.

[21] Appl. No.: 135,101

[22] Filed: Dec. 18, 1987

[51] Int. Cl.$^4$ .............................................. H03B 5/18
[52] U.S. Cl. .................................... 331/57; 331/108 B
[58] Field of Search ..................... 331/57, 108 B, 135; 368/158

[56] References Cited

U.S. PATENT DOCUMENTS 4,547,749  10/1985  Kuo ........................................ 331/57

Primary Examiner—Eugene R. LaRoche
Assistant Examiner—Robert J. Pascal
Attorney, Agent, or Firm—Bruce C. Lutz; V. Lawrence Sewell; H. Fredrick Hamann

[57] ABSTRACT

When an oscillator is required to operate at high frequencies, there may be more than one frequency that can provide the required 360° phase shift in the feedback signal, and thus more than one oscillating frequency. The present invention eliminates prior art inductors in assuring (for oscillators having an odd number of stages) that there is only a single range of frequencies having the desired phase shift in the feedback loop. In a three-stage oscillator, this is accomplished by designing the circuit to have 120° of phase shift in each stage at the desired oscillatory RF frequency, but 180° of phase shift at near DC frequency.

13 Claims, 1 Drawing Sheet

INDUCTORLESS MMIC OSCILLATOR

This invention was made with Government support under contract number F29601-85-C-0022 awarded by the Department of the Navy. The Government has certain rights in this invention.

THE INVENTION

The present invention is concerned generally with electronics, and more specifically, with an oscillator for use in integrated circuits, wherein it is desirable to eliminate inductances.

BACKGROUND

As is known to those skilled in the art, initial oscillation of a circuit after startup occurs at the first reached frequency at which the gain is greater than 1 and the signal being fed back is in-phase with the incoming signal. Circuits which have multiple possibilities of steady state oscillation will oscillate at the frequency which is first reached, oscillate at several of the frequencies, or start at one frequency and then switch to another frequency depending upon the interaction of two or more active devices exhibiting non-linear behavior within the circuit and/or the characteristics of the remaining portions of the circuit. Multiple frequency oscillation is undesirable where a stable reference source is the main design objective. It is therefore a design objective that the circuit have the possibility of oscillation at only one frequency even with changes in environmental conditions and power supply perturbances.

In the past, inductors have often been used to effectively lower the gain at the lower frequencies to less than 1 so that oscillations may occur only at the desired high frequency. However, inductors are expensive to make in integrated circuits because they require a large amount of chip area. It is thus desirable to design an oscillator which does not require inductors in the main signal path or the feedback path.

The present invention accomplishes the desired results of eliminating inductors by using an odd number of stages whereby the phase of the feedback and input signals are of substantially opposite phases at DC or near DC frequencies and converge to being in-phase at the desired high frequency. This is accomplished by placing capacitor-resistor combinations intermediate the stages, such that the phase shift for a given stage where there are three total stages is 120° at the desired oscillatory frequency. The phase shift networks increase inphase shift with increasing frequencies from DC to the desired frequency, while the phase shift of the amplifying FET decreases from substantially 180° at DC to in the neighborhood of 90° at the desired frequency. As is known, phase shift of an FET, with increasing frequencies of operation, decreases from initially 180° to in the neighborhood of 90° at signal frequencies in the L band. On the other hand, a phase shifting network of the type shown, has zero degrees phase shift at low frequencies and approximately 30° phase shift at the frequency of the L band. Thus, the inner stage phase shift networks are complimentary to the phase shift action of the individual amplifying or active portions of each stage to keep the total amplifier phase shift more nearly constant. As is also known to those skilled in the art, the phase shift of the FET is caused by internal parasitic (undesirable) capacitances. These parasitic capacitances have a value dependent in part upon the bias voltage applied to the gate of the FET. If a variable voltage is thus applied to one or more stages of the oscillator, a variable frequency oscillator can be obtained.

It is an object of the present invention to provide an improved oscillator circuit which eliminates the requirements for inductors and which can be easily applied to integrated circuit technology.

Other objects and advantages of this invention will be apparent from a reading of the specification and appended claims in conjunction with the drawings wherein:

DETAILED DESCRIPTION

Figure 1:
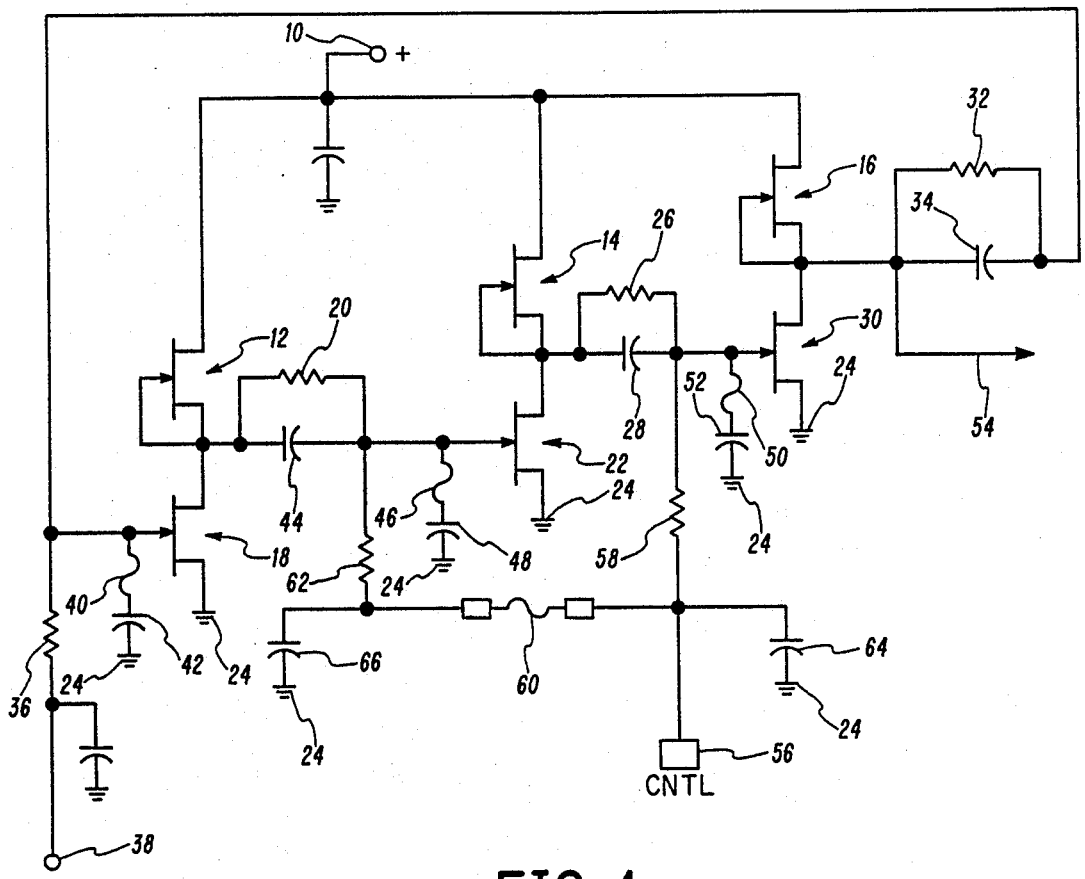
FIG. 1 is a schematic diagram of one embodiment of the inventive concept.

In FIG. 1, a positive power terminal 10 is shown connected to the drain of each of three FET's 12, 14 and 16. Each of these FET's has a gate connected to its source terminal. The source of FET 12 is connected to the drain of an FET, generally designated as 18, and is also connected through a resistor 20 to a gate of an FET 22. FET 22 has its drain connected to the gate and source of FET 14 and has its source connected to ground 24. The drain of FET 22 is connected to a parallel combination of a resistor 26 and capacitor 28 to a gate of an FET generally designated as 30. A drain of FET 30 is connected to the gate and source of FET 16. The source of FET's 18 and 30 are also connected to ground 24. The drain of FET 30 is connected through a parallel combination of a resistor 32 and a capacitor 34 to the gate of FET 18. The gate of FET 18 is also connected through a resistor 36 to a negative power supply potential 38, and is also connected through a fuse 40 and a capacitor 42 to ground 24. A capacitor 44 is connected between the drain of FET 18 and the gate of FET 22. A fuse 46 is connected in series with the capacitor 48 between the gate of FET 22 and ground 24. A similar combination of a fuse 50 and a capacitor 52 is connected between the gate of FET 30 and ground 24. The oscillator output signal is provided on lead 54 which is connected to the drain of FET 30. A control lead 56 is connected via a resistor 58 to the gate of FET 30 and is also connected through a fuse 60 and a resistor 62 to a gate of FET 22. A capacitor 64 is connected between control 56 and ground 24 and a further capacitor 66 is connected at the junction between fuse 60 and resistor 62 and connected at the other end to ground 24.

Figure 2:
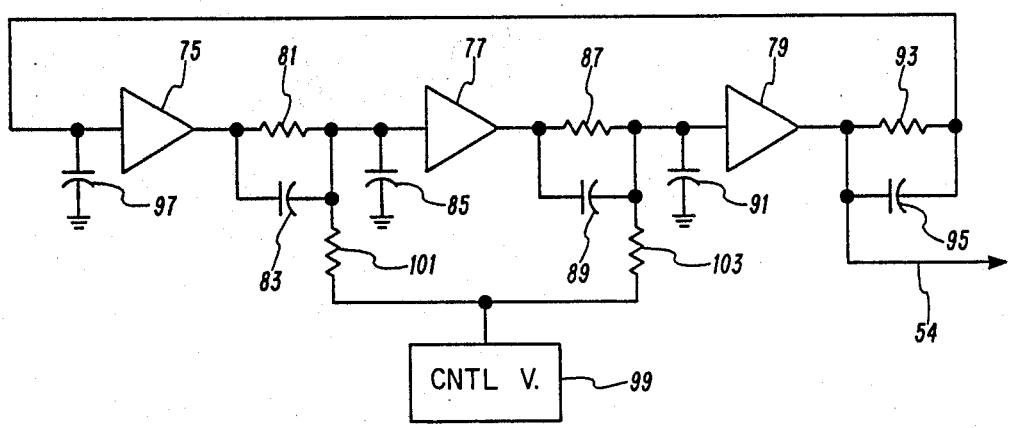
FIG. 2 is a block diagram of the oscillator of FIG. 1.

In FIG. 2, a trio of amplifiers 75, 77 and 79 represent the three amplifier stages of FIG. 1. As an example, amplifier 75 may represent the FET's 12 and 18. There is a set of capacitors between each amplification stage and associated resistors, such as resistor 81 and capacitors 83 and 85 shown between amplifiers 75 and 77. Components 87 through 97 are similar in nature and correspond in function to those in FIG. 1. Lead 54 is used as the output from amplifier 79 and corresponds to the similarly designated output of FIG. 1. Control signals are applied via the control terminal 99 through resistors 101 and 103.

OPERATION

As is well known to those skilled in the art, in order for an oscillator to sustain oscillation, the signal fed back from output to input of the oscillator must be in-phase, or in other words, have a 360° phase shift or an integer multiple thereof, so that any noise or signals tending to activate the oscillatory condition are reinforced. Further, this signal being fed back must have a gain of at least 1.

At DC, or very low frequency signals, the transistors act as phase inverters, or in other words, the phase shift of the signal through each stage of amplification, such as 18, is substantially exactly 180°. However, the FET's contain parasitic capacitances which affect the phase shift of the signal through the amplifier stage as the frequency rises. At DC, the capacitor 44 is seen as an open circuit by the signal and the signal is passed only through resistor 20 and again, there is no additional phase shift. Thus, at DC, the phase shift of the signal being returned from the drain of transistor 30 is 180° out of phase with any signals which might tend to commence the oscillatory condition at the gate of transistor 18. With the proper selection of values for interstage capacitors such as 44 and 48 and at least one resistor such as 20, the phase shift of each stage can be adjusted so that the declining phase shift from 180° of the FET's, such as FET 18, in combination with the increasing phase shift of the interstage connection, including capacitors 44 and 48 and resistor 20, becomes 120° for each of the three stages shown, so that at the appropriate oscillatory frequency the phase shift of the feedback signal is in-phase ($3 \times 120° = 360°$). Thus, as long as the three stages of amplification produce a total gain of at least 1 at this frequency, a stable oscillator will result. As previously mentioned, the FET's such as 22 and 30, have their own internal capacitances. These are termed parasitic, or stray capacitances, since in most cases they are undesirable. Further, these capacitances vary as a function of the gate voltage. Thus, if a variable control voltage is applied at terminal 56, and thus to the gates of FET's 22 and 30, the frequency of operation of the oscillator can be varied since the phase shift through the individual FET's 22 and 30 is varied, and the system will change in frequency to a value so that the feedback signal remains exactly in-phase with the FET 18. In other words, the stable condition is the in-phase condition and the circuit will seek this stable condition. If there is more than one frequency at which this condition can occur, the circuit dynamics are such that the circuit will always seek the lowest frequency at which the two conditions of the signal being in-phase and the gain being greater than 1 occur.

Due to the wide variation in gain factors of FETs designed to operate at high frequencies, the circuit may be too sensitive to given control voltage ranges applied at input 56 and become unstable. By removing the fuse 60, the signal can be applied to only one stage instead of two stages. The other stage is then biased with a fixed voltage similar to 38 of FIG. 1. This can be accomplished by placing a small voltage, such as two volts, across the ends of fuse 60 and vaporizing the previously provided electrical circuit path from the solid state substrate. Similar operations may be practiced on the fuse in series with capacitors such as 48 that are utilized between stages to disable the function of the capacitors and thus modify the interstage phase shifts, if the parasitic capacitances of the FETs vary too greatly from normal. In view of these fuse links, a greater variation in component values can be tolerated by adjusting the phase shift and sensitivity of the circuit to accommodate them.

FIG. 2 is merely a block diagram representation of the circuit of FIG. 1.

While three stages of amplification have been shown, any odd number of stages of amplification may be used, such that the feedback signal is out of phase for the low frequency signals and remains out of phase for any condition where the gain is at least equal to 1 for frequencies lower than the desired oscillatory frequency.

While I have illustrated only one embodiment of my inventive concept, I wish to be limited only by the scope of the appended claims, wherein

I claim:

1. High frequency oscillator apparatus comprising, in combination:
   a plurality of amplification stages;
   phase shifting means comprising part of each of said amplification stages, each of said phase shifting means including a resistor and capacitor in parallel for connecting a subsequent one of said amplification stages; and
   feedback means connected from a last to a first of said amplification stages.

2. Apparatus or claim 1, further comprising:
   control means connected to at least one of said phase shifting means for adjusting the bias of the subsequent amplification stage and thus the nominal phase shift of said at least one phase shifting means for controlling the frequency of oscillation of said high frequency oscillator apparatus.

3. Apparatus of claim 2, wherein said control means is connected to at least two of said phase shifting means.

4. Apparatus of claim 3, further comprising a fuse connected between said control means and one of said phase shifting means, wherein said fuse provides a means for disconnecting said control means from said one of said phase shifting means.

5. Apparatus of claim 2, wherein values of said resistors and capacitors are selected to adjust the phase shift of each of said amplification stages.

6. An oscillator circuit having an input and an output, comprising:
   a plurality of amplifier stages;
   a plurality of interstage filter circuits connecting successive ones of said amplifier stages for controlling gain and phase shift of the oscillator, wherein the total phase shift of the oscillator is in-phase with the input only at a desired frequency of oscillation;
   said filter circuits each including a resistor and capacitor connected in parallel; and
   feedback means connecting the output to the input for providing oscillation at the desired frequency.

7. The oscillator circuit of claim 6, further comprising a control means connected to at least one of said filter circuits for adjusting the phase shift and controlling the frequency of oscillation of the oscillator circuit.

8. The oscillator circuit of claim 7, wherein said control means is connected to at least two of said interstage filter circuits.

9. The oscillator circuit of claim 8, further comprising a fuse connected between said control means and one of said interstage filter circuits, wherein said fuse provides a means for disconnecting said control means from said one of said interstage filter circuits.

10. The oscillator circuit of claim 6, wherein values of said resistors and capacitors are selected to adjust the phase shift of each of said amplifier stages.

11. A high frequency oscillator having an input and an output, comprising:
   a plurality of FET amplifier stages;

a plurality of interstage connectors for connecting successive ones of said amplifier stages, each of said connectors comprising a resistor and capacitor in parallel;

a feedback loop connecting the output to the input; and a control line connected to at least two of said interstage connectors for adjusting the phase shift to control the frequency of oscillation of the high frequency oscillator.

12. The high frequency oscillator of claim 11, further comprising a control line fuse connecting said control line to one of said interstage connectors, wherein said fuse provides a means for disconnecting said control line from said one of said interstage connectors.

13. The high frequency oscillator of claim 11, wherein each of said interstage connectors further includes a connector fuse in series with a second capacitor connected to ground, said connector fuse providing a means for disconnecting said second capacitor from said interstage connector and thereby adjusting the phase shift.

* * * * *